United States Patent
Martinson et al.

(10) Patent No.: US 6,760,976 B1
(45) Date of Patent: Jul. 13, 2004

(54) METHOD FOR ACTIVE WAFER CENTERING USING A SINGLE SENSOR

(75) Inventors: Robert Martinson, San Mateo, CA (US); Dhairya Shrivastava, Los Altos, CA (US); Matthew Weis, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 14 days.

(21) Appl. No.: 10/342,550

(22) Filed: Jan. 15, 2003

(51) Int. Cl.[7] .............................................. G01D 21/00
(52) U.S. Cl. ............................ 33/520; 33/644; 33/613; 414/936; 702/94
(58) Field of Search ................... 33/613, 520, 644–645; 414/935–936; 702/94–95; 73/1.79

(56) References Cited

U.S. PATENT DOCUMENTS

| | | | |
|---|---|---|---|
| 4,819,167 A | 4/1989 | Cheng et al. | |
| 4,833,790 A | 5/1989 | Spencer et al. | |
| 4,934,064 A | * 6/1990 | Yamaguchi et al. | 33/645 |
| 5,365,672 A | * 11/1994 | Kato | 33/520 |
| 5,452,521 A | * 9/1995 | Niewmierzycki | 33/520 |
| 5,483,138 A | 1/1996 | Shmookler et al. | |
| 6,094,965 A | * 8/2000 | Hubbard et al. | 33/562 |
| 6,388,436 B1 | * 5/2002 | Nodot et al. | 414/936 |
| 6,542,839 B1 | * 4/2003 | Lu et al. | 33/520 |
| 2003/0231950 A1 | * 12/2003 | Raaijmakers | 414/935 |

* cited by examiner

*Primary Examiner*—Diego Gutierrez
*Assistant Examiner*—Yartiza Guadalupe
(74) *Attorney, Agent, or Firm*—DeLio & Peterson, LLC; Robert Curcio

(57) ABSTRACT

A method for a robotic semiconductor wafer processing system to correct for wafers that have become offset or off-center during wafer processing. This is accomplished by determining the amount of offset and re-centering the wafer during wafer transport to the next process station using a single station sensor to locate the wafer center point. Each single sensor located at each station activates when the wafer's edge traverses through the sensor's path. Directional coordinates for the measured designated points on the wafer's edge are calculated, and the intersection points of two circles, analytically derived from using the measured designated points as their centers, are determined. The intersection point closest to the true wafer center position represents the measured wafer's center point. This point is compared to the true wafer center position, and the wafer is then adjusted for this difference.

34 Claims, 2 Drawing Sheets

METHOD FOR ACTIVE WAFER CENTERING USING A SINGLE SENSOR

BACKGROUND OF THE INVENTION

1. Field of the Invention

The invention relates to semiconductor wafer processing, and more specifically, to position control or centering of a wafer on the semiconductor manufacturing tool's robotic arm, for positioning and repositioning of the wafer during wafer transport.

2. Description of Related Art

As wafers transfer from station to station in a semiconductor manufacturing system, tolerance stack-up as well as handling problems, such as ESC sticking, result in wafer offset that causes process shift, which may ultimately lead to wafer loss. It is therefore desirable for the transfer robot to measure wafer offset and correct this offset at each station transfer.

Typically, multiple sensors are required to empirically and analytically derive the wafer center position. Sensors can be activated upon wafer movement, and a plurality of sensors can be used to determine the wafer's exact position in a station at a given moment. In U.S. Pat. No. 5,483,138 issued to Shmookler et al. on Jan. 9, 1996, entitled "SYSTEM AND METHOD FOR AUTOMATED POSITIONING OF A SUBSTRATE IN A PROCESSING CHAMBER," a robotic handling system is taught using an array of sensors positioned generally transverse to the path of movement of a substrate to detect the relative positions of the substrate for the purpose of precisely aligning the substrate relative to a predetermined destination point. In Shmookler, a minimum of two sensors is required to practice the disclosed invention.

Other known methods for locating the center point of a semiconductor wafer include those discussed in Spencer et al., U.S. Pat. No. 4,833,790, issued May 30, 1989, entitled "METHOD AND SYSTEM FOR LOCATING AND POSITIONING CIRCULAR WORKPIECES," and Cheng et al., U.S. Pat. No. 4,819,167, issued Apr. 4, 1989, entitled "SYSTEM AND METHOD FOR DETECTING THE CENTER OF AN INTEGRATED CIRCUIT WAFER." In Spencer, an apparatus, separate and apart from the processing system, utilizes a "spindle" type method where the wafer is incrementally rotated. Spencer does not take advantage of the direct movement of the wafer as it is transferred from the wafer storage cassette. Cheng requires an array of optical sensors positioned generally transverse to the linear path of the wafer support blade. Moreover, the wafer must pass over the sensors in a linear path transverse to the position of the sensors, which are positioned adjacent to the loadlock chamber. This makes the Cheng design ill suited to multiple chamber wafer processing systems.

In these processes, multiple sensors are used to locate the wafer in-situ while the wafer is being transferred to or placed within a station. With multiple sensors in an array, each algorithm employed necessarily requires multiple sensor activation information, which is ultimately converted into multiple location coordinate points.

Bearing in mind the problems and deficiencies of the prior art, it is therefore an object of the present invention to provide a method for measuring wafer offset using a single station sensor.

It is another object of the present invention to provide an improved method for determining location of a semiconductor substrate in a wafer processing system and correcting this offset at each station transfer.

Still other objects and advantages of the invention will in part be obvious and will in part be apparent from the specification.

SUMMARY OF THE INVENTION

The above and other objects, which will be apparent to those skilled in art, are achieved in the present invention that is directed to a method of centering a wafer within a semiconductor processing apparatus having multiple stations and a single sensor at each of the stations, the method comprising: calibrating a true wafer center position for each of the stations; calculating and storing the calibrated wafer center positions; determining a location for each of the sensors; storing the sensor locations; measuring locations for first and second edge points on the wafer using the single sensor; and calculating a center of the wafer from the stored calibrated wafer position and the first and second edge point locations. The step of calculating the center of the wafer further comprises: analytically deriving intersection points of two circles having the first and second edge points as center points and radii equal to the wafer radius; storing the intersection point closest to the true wafer center position as the center of the wafer; comparing the center of the wafer to the true wafer center position; and adjusting the wafer to the true wafer center position. The method further includes using a paddle having a known feature to locate the true wafer center position, and calculating and storing radial and angular values of the true wafer center for each of the stations. The step of comparing the calculated center of the wafer to the true wafer center position may include matching the true wafer center position with individual transition positions of the wafer, or end effector calibration features, to determine wafer displacement at each of the transition positions. The step of measuring first and second edge points on the wafer may further include activating the sensor a first time by moving the wafer to the station, and activating the sensor a second time by extending the wafer into a module of the station.

In a second aspect, the present invention is directed to a method of centering a wafer having a center and a radius in a semiconductor processing station having a sensor, comprising: calibrating a true wafer center position for the station; activating the sensor at a first transition point; defining the first transition point with a first set of radial and angular coordinates; calculating a second set of radial and angular coordinates for the first transition point; activating the sensor at a second transition point; defining the second transition point with a third set of radial and angular coordinates; and analytically deriving the intersection of two circles having the first and second transition points as center points and radii equal to the wafer radius. The step of analytically deriving the intersection of two circles may include discarding an intersection point furthest from the true wafer center position and storing a remaining intersection point as a calculated wafer center position. The method may further comprise: comparing the calculated wafer center position to the true wafer center position; and adjusting the wafer to the true wafer center position.

In a third aspect, the present invention is directed to a method for detecting a center point of a wafer having a radius and an edge, positioned in a robotic holder of a semiconductor process system using a single sensor for determining the wafer's instantaneous position, the method comprising: providing one sensor having a defined line-of-sight and capable of activation when the wafer is moved by the robotic holder to cross the sensor's line of sight; calibrating the semiconductor process system to establish a true center position for the wafer; moving the wafer along a predetermined path to activate the sensor at first and second end points on the wafer's edge; determining coordinate positions of the true center position, and the first and second end points; calculating a wafer center point from the coordinate positions; and moving the wafer using the robotic holder to adjust the wafer center point to the true center position. The step of calculating a wafer center point further comprises: deriving two circles having centers located at each of the coordinate positions of the end points, and each having a radius equal to the wafer radius; calculating two intersection points of the two circles; and discarding one of the two intersection points furthest from the true center position, using the other of the intersection points as the wafer center point.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
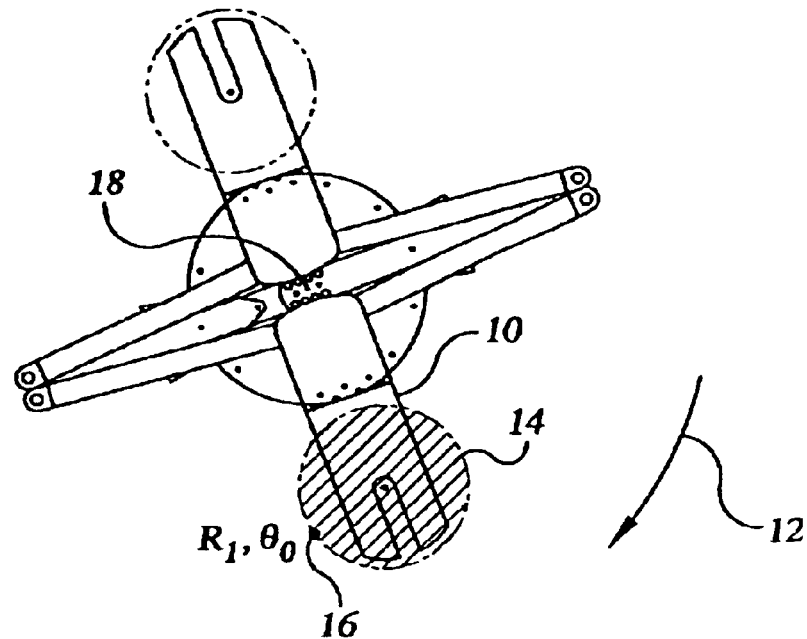
FIG. 1A is an overhead schematic of a robotic arm transitioning a wafer to a station.

In describing the preferred embodiment of the present invention, reference will be made herein to FIGS. 1–2 of the drawings in which like numerals refer to like features of the invention.

The process described herein allows a robotic apparatus to correct for wafers that have become offset or off-center during wafer processing. This is accomplished by determining the amount of offset and re-centering the wafer during wafer transport to the next process station using a single station sensor to locate the wafer center point.

The apparatus for conducting the preferred method of wafer centering includes primarily a semiconductor wafer handling sub-system that is comprised of a chamber, a robotic arm for transferring wafers to a plurality of stations with at least one sensor located at a point in front of each station. The method of operation employs the single sensors located at each station to acquire directional coordinates for designated points on the wafer's edge. This gives the instant invention the advantage of being compatible with previous wafer transport designs that have used single sensors for wafer presence detection only.

During operation, each station's sensor location must be determined so that accurate position data can be computed. To locate each sensor, a robot having two robotic paddles is utilized with a predetermined feature on each of the two paddles to activate and thereby locate the sensor with respect to the paddle's center. This feature may be a hole in the paddle, or conversely a solid feature, such as a calibration fixture that enables the robotic arm to simulate a centered wafer. For each station sensor activated by the paddle feature, the robot stores a radial and angular position, $R_{sensor}$ and $\theta_{sensor}$, respectively. These coordinates are stored in the processing system's electronic memory or other attached memory device for later use in the wafer-centering computations.

The transition point of each station sensor is unique such that a wafer moving through the sensor's transition field with the same motion characteristics will yield different captured radial and angular direction values. Captured data variation also exists between two transition types: dark-to-light and light-to-dark transitions. To offset these phenomena, a calibration or "teaching" wafer or an accurately placed standard wafer is placed or affixed at the end-effector's center, and subjected to all possible transition sequences. Additionally, features may be added to the end-effector that could be used for calibration instead of using a calibration fixture. The resultant calculated radial and angular wafer center values are then stored for each active station under each transition sequence. During normal operation, transition points are logged as well as the transition characteristics, such as the transition on rotation from one station, the transition on motion to another station, the retraction on a pick from one station, and the extension on a place to another station. The wafer center is calculated for all possible transition sequences, and each resultant wafer center calculation is stored for each active station. The appropriate calibrated wafer center is then matched with individual transition characteristics, and used to determine actual wafer displacement.

Figure 1B:
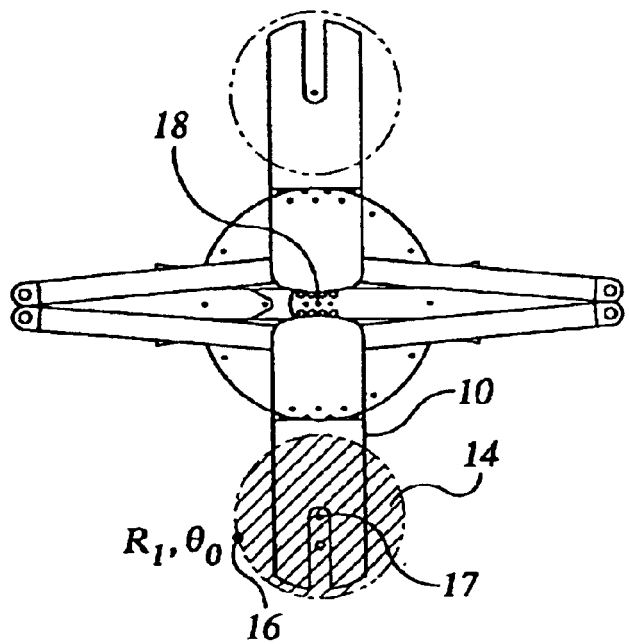
FIG. 1B is an overhead schematic of the robotic arm of FIG. 1A with the wafer secured in position after transitioning to a new station.

Importantly, wafer center calculations are performed based on measurements from a single stationary sensor. Two sensor transitions are used to establish coordinate positions; once during the rotate to-put maneuver, and the other during the put-to station motion. As the wafer rotates to the station for the to-put motion, the sensor's first transition is at the wafer's edge. Upon sensor activation, this position is defined with radial and angular coordinates as radius $R_1$ or $R_{sensor}$, and angle $\theta_o$ or $\theta_{sensor}$. FIG. 1A depicts this first step in the wafer transition. Robotic arm 10 is shown rotating in the direction of arrow 12 moving wafer 14 across a point 16 where its edge intersects sensor coordinates $R_1$, $\theta_o$. The radius is measured from the center 18 of the robotic arm. Radius $R_1$ is the distance of the sensor's position from the robotic arm center. The coordinates of this transition point are stored, as wafer 14 continues its known movement to its first completed position, as shown in FIG. 1B. As the wafer rotation is completed, bringing the wafer to rest at the station, a new angle $\theta_1$, is calculated for wafer point 16, from the known sweep angle of the arm, which can be deduced from the angle at retraction, $\theta_{retract}$, the angle at transition, $\theta_{transition}$, and the original angle $\theta_o$. Wafer point 17 depicts the center of the wafer in its retract position, having coordinates $R_{retract}$ and $\theta_{retract}$. Angle $\theta_1$ is the total sweep angle relative to the original angular position, $\theta_{sensor}$. It represents the angle defined by the retract position to the sensor transition angular position as measured from the original angular position of the station sensor, such that $\theta_1=\theta_{retract}-\theta_{transition}+\theta_{sensor}$. The transition angle, $\theta_{transition}$, represents the difference between the wafer center at retract and the wafer position at $\theta_1$. Angle $\theta_1$ measures the sweep of radius $R_1$ from the first transition point or read point to the wafer position at the station. Throughout this motion, including when the wafer is at rest at the station, the radius $R_1$ remains constant. Thus, at the station location, the wafer's edge point 16 is analytically located by the radial and angular coordinates $R_1$ and $\theta_1$, as shown in FIG. 1B.

Figure 1C:
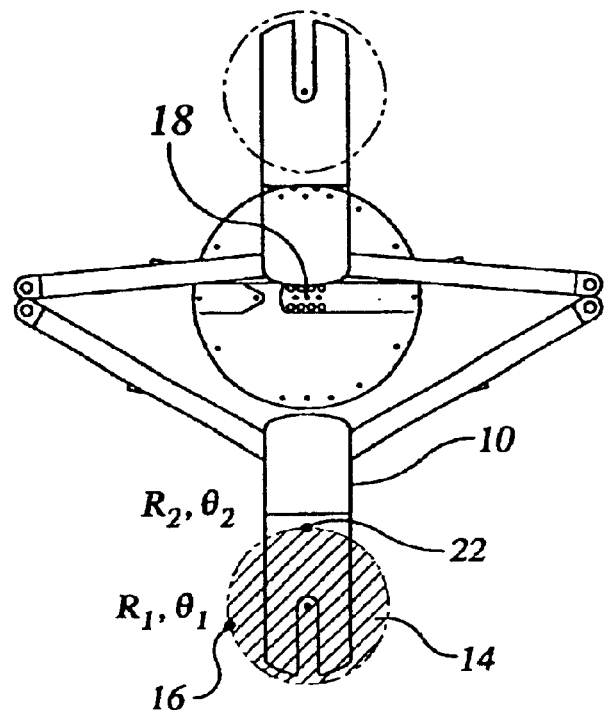
FIG. 1C is an overhead schematic of the robotic arm of FIG. 1B depicting the robotic arm during an extension, which places the wafer into the module.

FIG. 1C depicts the robotic arm 10 during an extension, which ultimately places wafer 14 into the module. During this movement, the sensor is activated as the wafer crosses a new transition point 22, which is again at the wafer's edge. At this location, both the radial and angular coordinates are changed, since the end effector extends the wafer away from the center of the robotic arm 18. The new coordinates are defined as $R_2$ and $\theta_2$, and can be calculated from the previous coordinate information as follows:

$$|R_2|=[|R_{sensor}|\cdot\sin(\theta_{sensor}-\theta_{retract})]/\sin(\theta_2)$$

$$\theta_2=\tan^{-1}[(|R_{sensor}|\cdot\sin(\theta_{sensor}-\theta_{retract}))/(|R_{sensor}|\cdot\cos(\theta_{sensor}-\theta_{retract})-|R_{transition}|+|R_{retract}|)]$$

To assure commonality between these location points, their positions are shifted so that they lie on the wafer at the current station retract position. This method can similarly be used during the wafer "get" and "rotate for put" actions. This sequence is also advantageous for detecting gross off-center placement before a put or place is attempted.

Figure 2:
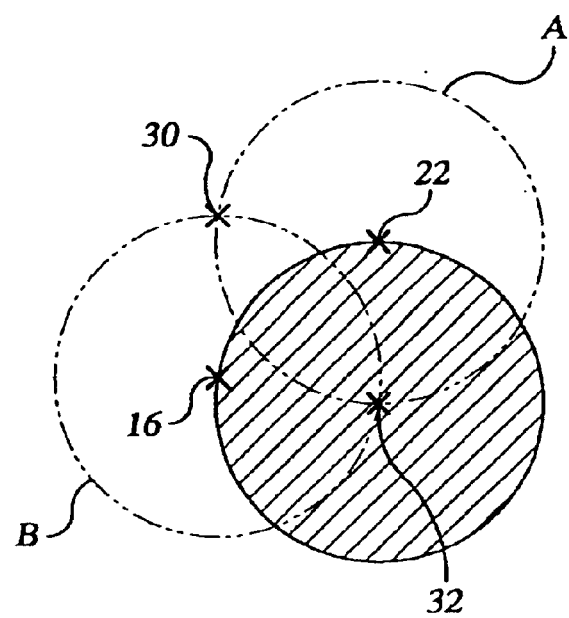
FIG. 2 is a drawing of two imaginary circles centered on the sensor transition points, and having radii equal to the radius of the wafer.

FIG. 2 depicts two imaginary circles A, B centered on the sensor transition points, and having radii equal to the radius of the wafer. By solving for the intersection points 30, 32 of the two imaginary circles A, B, the center point of the wafer can be located. In order to solve for the location of the center point, the center and radius data for each imaginary circle must be constrained to the standard circle equation, $(x-h)^2+(y-k)^2=r^2$. Next, combining and solving the resulting quadratic equation for two distinct roots determines the intersection points.

Solving for the intersection of the two imaginary circles in Cartesian coordinates yields:

$$y=(y_2+y_1)/2+(y_2-y_1)(r_1^2-r_2^2)/2d^2-/+((x_2-x_1)/2d^2)[((r_1+r_2)^2-d^2)(d^2-(r_2-r_1)^2)]^{1/2};$$

$$x=(x_2+x_1)/2+(x_2-x_1)(r_1^2-r_2^2)/2d^2+/-((y_2-y_1)/2d^2)[((r_1+r_2)^2-d^2)(d^2-(r_2-r_1)^2)]^{1/2};$$

where, $$d=[(x_2-x_1)^2+(y_2-y_1)^2]^{1/2};$$

$$r_1=r_2=r_{wafer};\text{ and}$$

$$2r_{wafer}=W.$$

Simplifying the above gives:

$$y=(y_2+y_1)/2-/+(x_2-x_1)/2d^2[W^2-d^2]^{1/2}d^2;\text{ and}$$

$$x=(x_2+x_1)/2+/-(y_2-y_1)/2d^2\cdot W^2-d^2]^{1/2}d^2.$$

The relationship between polar and Cartesian coordinates yields the following expressions:

$$x_1=|r_1|\cos\theta_1;\ y_1=|r_1|\sin\theta_1;$$

$$x_2=|r_2|\cos\theta_2;\ y_2=|r_2|\sin\theta_2;$$

where $r_1$, $\theta_1$, and $r_2$, $\theta_2$, represent the first and second captured transition point values.

Substituting the polar equivalents for these known Cartesian values, and solving for the polar coordinates of the two intersects, yields the following wafer center positions:

$$\theta_{w1}=\pi+\arctan(y_1/x_1);$$

$$R_{w1}=y_1/\sin(\theta_{w1});$$

$$\theta_{w2}=\pi+\arctan(y_2/x_2);\text{ and}$$

$$R_{w2}=y_2/\sin(\theta_{w2});$$

where $R_{w1}$, $\theta_{w1}$, $R_{w2}$, and $\theta_{w2}$ represent the polar coordinate locations of the calculated wafer center positions.

Last, the intersection point that is furthest from the R and $\theta$ position of the current station's calibrated transition wafer center is then discarded. The remaining intersection point thus determines the wafer center position.

In order to determine if a wafer is off-center, a known "good", empirically derived center location of the wafer is first stored for each enabled sensor location. This operation is performed during a station "teaching" step when an operator can ensure that the wafer is perfectly centered on the robotic arm. Alternatively, a circular feature, such as a fixture, may be used instead of a wafer, or calibration features on the robot end-effector, can be used to establish the known center point. Calibration then follows the same analytical steps above, but in this case the "good" center point is stored in system memory for comparison. A known "good" center point is stored for each station's retracted position.

During the put-move, the measured center of the wafer is compared to the known "good" center having like transition characteristics, such as light-to-dark rotational transition and dark-to-light extension transition. The offset from the known "good" center is then determined and the radial and angular coordinates of the extended position are updated so that the wafer can mechanically be placed on center.

Similarly, one may use the center-point methodology of the instant invention solely as a detector of off-center wafers. In this manner, the known "good" center is compared with the center of the wafer being transferred out of the process module. If the offset is greater than a predetermined error limit, the robotic system may be programmed to initiate an error flag or other corrective measures.

The difference in the actual wafer position to the calibrated wafer position is computed by determining the radial distance, $r_d$, between the two centers. This is equivalent to the polar equation of a circle with the center at the calibrated position and a point lying on the circle as the R and $\theta$ of the actual position. If $R_w$ and $\theta_w$ denote the radius and angular position of the actual wafer, and $R_{cal}$ and $\theta_{cal}$ denote the calibrated coordinates, then $$r_d=[(|R_w|^2-2|R_w||R_{cal}|\cos(\theta_w-\theta_{cal})+|R_{cal}|^2]^{1/2}$$

Once the wafer center is determined, the necessary offsets can be calculated to place the off-center wafer on center. The offset calculations are performed by subtracting the calculated wafer center, $R_w$ and $\theta_w$, from the placement station's calibrated wafer center position, $R_{cal}$ and $\theta_{cal}$.

$$R_{offset}=R_{cal}-R_w;\text{ and}$$

$$\theta_{offset}=\theta_{cal}-\theta_w.$$

The radial and angular values may then be used in a command fashion, such as a PLACE WITH OFFSET command, to enable the robotic system to accommodate and correct for the offset required.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of centering a wafer within a semiconductor processing apparatus having multiple stations and a single sensor at each of said stations, said method comprising:
   calibrating a true wafer center position for each of said stations;
   calculating and storing said calibrated wafer center positions;
   determining a location for each of said sensors;
   storing said sensor locations;
   measuring locations for first and second edge points on said wafer using said single sensor; and
   calculating a center of said wafer from said stored calibrated wafer position and said first and second edge point locations.

2. The method of claim 1 wherein said step of calculating said center of said wafer further comprises:
   analytically deriving intersection points of two circles having said first and second edge points as center points and radii equal to said wafer radius;
   storing said intersection point closest to said true wafer center position as said center of said wafer;
   comparing said center of said wafer to said true wafer center position; and
   adjusting said wafer to said true wafer center position.

3. By The method of claim 2 wherein said step of comparing said calculated center of said wafer to said true wafer center position includes matching said true wafer center position with individual transition positions of said wafer to determine wafer displacement at each of said transition positions.

4. The method of claim 1 wherein said calibrating step includes using a paddle having a known feature to locate said true wafer center position.

5. The method of claim 4 wherein said feature includes a hole in said paddle or a solid segment on a surface of said paddle.

6. The method of claim 1 further comprising calculating and storing radial and angular values of said true wafer center for each of said stations.

7. The method of claim 1 further comprising calculating and storing radial and angular values for each of said sensor locations.

8. The method of claim 1 wherein said calibrating step includes using a standard wafer having a known feature to locate said true wafer center position and affixed to an end effector.

9. The method of claim 1 wherein said calibrating step includes subjecting said wafer, or end effector calibration features, to all possible transition sequences of wafer motion in said station.

10. The method of claim 9 further comprising subjecting said wafer to a transition or rotation motion of said wafer from one of said stations to another of said stations.

11. The method of claim 9 further comprising subjecting said wafer to a transition on motion from one of said stations to another of said stations.

12. The method of claim 9 further comprising subjecting said wafer to a retraction or a pick from one of said stations.

13. The method of claim 9 further comprising subjecting said wafer to an extension or a place to one of said stations.

14. The method of claim 1 wherein said step of measuring first and second edge points on said wafer further includes activating said sensor a first time by moving said wafer to said station, and activating said sensor a second time by extending said wafer into a module of said station.

15. A method of centering a wafer having a center and a radius in a semiconductor processing station having a sensor, comprising:
   calibrating a true wafer center position for said station;
   activating said sensor at a first transition point;
   defining said first transition point with a first set of radial and angular coordinates;
   calculating a second set of radial and angular coordinates for said first transition point;
   activating said sensor at a second transition point;
   defining said second transition point with a third set of radial and angular coordinates; and
   analytically deriving the intersection of two circles having said first and second transition points as center points and radii equal to said wafer radius.

16. The method of claim 15 wherein said step of analytically deriving the intersection of two circles further includes discarding an intersection point furthest from said true wafer center position and storing a remaining intersection point as a calculated wafer center position.

17. The method of claim 16 further comprising:
   comparing said calculated wafer center position to-said true wafer center position; and
   adjusting said wafer to said true wafer center position.

18. The method of claim 15 wherein said step of activating said sensor at a first transition point comprises rotating said wafer to said station.

19. The method of claim 18 further comprising rotating said wafer using a robotic arm having a center point.

20. The method of claim 19 including measuring said first, second, and third sets of radial coordinates from said center point of said robotic arm.

21. The method of claim 15 wherein said first transition point includes a point on an edge of said wafer.

22. The method of claim 15 wherein said step of defining said first transition point with a first set of radial and angular coordinates further comprises electronically storing said coordinates.

23. The method of claim 15 wherein said step of calculating said second set of radial and angular coordinates further includes bringing said wafer to rest in said station.

24. The method of claim 15 wherein said step of calculating said second set of radial and angular coordinates further includes calculating from a known sweep angle of said robotic arm.

25. The method of claim 24 including calculating from a known angle of retraction, angle of transition, and original sensor angle.

26. The method of claim 25 further including an analytical relationship between said angle of retraction $\theta_{retract}$, angle of transition $\theta_{transition}$, and original sensor angle $\theta_{sensor}$, such that $\theta_{retract} = \theta_{transition} + \theta_{sensor}$.

27. The method of claim 15 wherein said second transition point includes a point on an edge of said wafer.

28. The method of claim 15 wherein said second transition point is a point different from said first transition point.

29. The method of claim 15 wherein said step of activating said sensor at a second transition point comprises placing said wafer within a module in said station.

30. The method of claim 29 further comprising extending a robotic arm holding said wafer.

31. The method of claim 15 wherein said step of defining said second transition point with a third set of radial and angular coordinates includes calculating said third set of coordinates from said first and second set of coordinates.

32. A method for detecting a center point of a wafer having a radius and an edge, positioned in a robotic holder of a semiconductor process system using a single sensor for determining said wafer's instantaneous position, said method comprising:

providing one sensor having a defined line-of-sight and capable of activation when said wafer is moved by said robotic holder to cross said sensor's line of sight;

calibrating said semiconductor process system to establish a true center position for said wafer;

moving said wafer along a predetermined path to activate said sensor at first and second end points on said wafer's edge;

determining coordinate positions of said true center position, and said first and second end points;

calculating a wafer center point from said coordinate positions; and moving said wafer using said robotic holder to adjust said wafer center point to said true center position.

33. The method of claim 32 wherein said step of calculating a wafer center point further comprises:

deriving two circles having centers located at each of said coordinate positions of said end points, and each having a radius equal to said wafer radius;

calculating two intersection points of said two circles; and discarding one of said two intersection points furthest from said true center position, using the other of said intersection points as said wafer center point.

34. The method of claim 32 wherein said step of moving said wafer includes calculating a difference between coordinates of said wafer center point and coordinates of said true center position, and moving said wafer by said difference.

* * * * *